United States Patent
Kramer et al.

(10) Patent No.: US 11,556,064 B2
(45) Date of Patent: Jan. 17, 2023

(54) STAGE APPARATUS AND METHOD FOR CALIBRATING AN OBJECT LOADING PROCESS

(71) Applicant: ASML Netherlands B.V., Veldhoven (NL)

(72) Inventors: Gijs Kramer, Nijmegen (NL); Theodorus Marcus Nagtegaal, Eindhoven (NL); André Schreuder, Eindhoven (NL); Anna Catharina Verkaik, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/269,328

(22) PCT Filed: Jul. 22, 2019

(86) PCT No.: PCT/EP2019/069685
§ 371 (c)(1),
(2) Date: Feb. 18, 2021

(87) PCT Pub. No.: WO2020/038677
PCT Pub. Date: Feb. 27, 2020

(65) Prior Publication Data
US 2021/0311403 A1     Oct. 7, 2021

(30) Foreign Application Priority Data
Aug. 23, 2018   (EP) ..................................... 18190476

(51) Int. Cl.
*G03F 7/20*   (2006.01)
(52) U.S. Cl.
CPC ............................... *G03F 7/70725* (2013.01)

(58) Field of Classification Search
CPC .... G03F 7/7085; G03F 7/707; G03F 7/70775; G03F 7/70725
(Continued)

(56) References Cited

U.S. PATENT DOCUMENTS

| | | |
|---|---|---|
| 5,406,092 A | 4/1995 | Mokuo |
| 5,844,683 A | 12/1998 | Pavloski et al. |

(Continued)

FOREIGN PATENT DOCUMENTS

| | | |
|---|---|---|
| JP | H06-132269 A | 5/1994 |
| JP | H10-50790 A | 2/1998 |

(Continued)

OTHER PUBLICATIONS

International Search Report and Written Opinion of the International Searching Authority directed to related International Patent Application No. PCT/EP2019/069685, dated Oct. 22, 2019; 13 pages.

*Primary Examiner* — Hung V Nguyen
(74) *Attorney, Agent, or Firm* — Sterne, Kessler, Goldstein & Fox P.L.L.C.

(57) ABSTRACT

The invention provides a stage apparatus, comprising an object support comprising a ring shaped protrusion having an outer radius in a first plane, and configured to support an object with a radius in the first plane larger than the outer radius of the ring shaped protrusion. The stage apparatus further comprises a sensor module configured to detect the object support, and the object when it is arranged on the object support. The stage apparatus further comprises a processing unit configured to receive one or more signals from the sensor module, and to determine, based on said one or more signals, a position of the object relative to the ring shaped protrusion when the object is arranged on the object support. The processing unit is further configured to determine, based on said position of the object, an offset value (Continued)

representing the position of the object relative to the ring shaped protrusion.

18 Claims, 10 Drawing Sheets

(58) Field of Classification Search
USPC .................................................... 355/72–76
See application file for complete search history.

(56) References Cited

U.S. PATENT DOCUMENTS

| | | | |
|---|---|---|---|
| 6,020,964 | A | 2/2000 | Loopstra et al. |
| 6,952,253 | B2 | 10/2005 | Lof et al. |
| 8,149,387 | B2 * | 4/2012 | Alberti ................ G03F 7/70783 355/72 |
| 8,519,363 | B2 | 8/2013 | Tanaka et al. |
| 8,860,955 | B2 | 10/2014 | Rodnick et al. |
| 9,740,106 | B2 | 8/2017 | Hoogendam et al. |
| 9,835,957 | B2 * | 12/2017 | Houben .............. H01L 21/6875 |
| 9,991,145 | B2 | 6/2018 | Minami |
| 2004/0036850 | A1 * | 2/2004 | Tsukamoto ............. G03F 7/707 355/72 |
| 2007/0058173 | A1 | 3/2007 | Holzapfel |
| 2009/0180095 | A1 | 7/2009 | Alberti et al. |
| 2011/0232075 | A1 * | 9/2011 | Yamauchi ........... G03F 7/70816 29/559 |
| 2012/0100709 | A1 | 4/2012 | Minami |
| 2012/0274920 | A1 * | 11/2012 | Bex ..................... G03F 7/70716 355/72 |

FOREIGN PATENT DOCUMENTS

| | | |
|---|---|---|
| JP | H11-040648 A | 2/1999 |
| JP | 2000-012657 A | 1/2000 |
| JP | 2006-173607 A | 6/2006 |
| JP | 2011-508454 A | 3/2011 |
| JP | 2011-181755 A | 9/2011 |
| JP | 2011-222733 A | 11/2011 |
| JP | 2012-107311 A | 6/2012 |
| JP | 2013-055277 A | 3/2013 |
| JP | 2014-003259 A | 1/2014 |
| KR | 2008-0048642 A | 6/2008 |
| TW | 2012-29307 A | 7/2012 |

* cited by examiner

STAGE APPARATUS AND METHOD FOR CALIBRATING AN OBJECT LOADING PROCESS

CROSS-REFERENCE TO RELATED APPLICATION

This application claims priority of EP application 18190476.4 which was filed on Aug. 23, 2018 and which is incorporated herein in its entirety by reference.

FIELD

The present invention relates to a stage apparatus comprising an object table, in particular to the arranging of an object on said object table.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

While the pattern is being projected on the substrate, the substrate is typically mounted on a substrate support, and held on said support, e.g. by means of a vacuum clamp. Such a substrate support may e.g. comprises a plurality of burls and e.g. a ring shaped protrusion surrounding the burls. The mounting of the substrate relative on said substrate support is conventionally performed by a robot such as a handling robot to be within certain tolerances.

Developments in recent years, such as so-called 3DNAND and 3D Xpoint substrates, have led to the substrates more often not being flat but having an out-of-plane shape, e.g. warped or bended. This may e.g. be a consequence of an increasing number of layers which have internal stresses. It has been observed that a proper clamping of such warped or bended substrates by the clamp of the substrate support may require a more accurate positioning of the substrate relative to the substrate support. It would therefore be desirable to provide a more accurate mounting of a substrate to a substrate support.

SUMMARY

It is an object of the present invention to provide an alternative stage apparatus. It is in particular an object of the present invention to enable determining of the position of an object relative to an object support, and to allow a more accurate mounting of objects to an object support.

This object is achieved with a stage apparatus, comprising an object support comprising a ring shaped protrusion having an outer radius in a first plane, and configured to support an object with a radius in the first plane larger than the outer radius of the ring shaped protrusion. The stage apparatus further comprises a sensor module configured to detect the object support, and the object when it is arranged on the object support. The stage apparatus further comprises a processing unit configured to receive one or more signals from the sensor module, and to determine, based on said one or more signals, a position of the object relative to the ring shaped protrusion when the object is arranged on the object support. The processing unit is further configured to determine, based on said position of the object, an offset value representing the position of the object relative to the ring shaped protrusion.

The invention thus provides in a stage apparatus wherein an offset value is determined representing the position of the object relative to the ring shaped protrusion. Based on said offset value the position of the object and/or subsequent objects can be adjusted.

In an embodiment the sensor module is configured to detect the object support when no object is arranged on the object support. Advantageously no object is arranged above the ring shaped protrusion when the object support is detected, such that relatively simple measurement techniques may be applied in the sensor module while said sensor module is arranged above the object support.

In an embodiment the sensor module is configured to detect the object support by detecting the ring shaped protrusion. Advantageously the position of the object relative to the ring shaped protrusion can easily be determined. In addition the measurement and the determination of said position of the object relative to the ring shaped protrusion may be more robust, e.g. because a used algorithm is simpler.

In an embodiment the processing unit further comprises an output terminal configured to output the offset value to a control unit of an object handler and/or a control unit of an object support positioner. Advantageously the offset value can be taken into account to adjust the position of the object or subsequent objects relative to the ring shaped protrusion with the object handler or the object support positioner.

In an embodiment the stage apparatus further comprises an object handler, which object handler comprises: a robot arm configured to provide a subsequent object to the object support, and a control unit configured control, based on said offset value: a position of said subsequent object relative to the robot arm when the robot arm receives said subsequent object, and/or a position of the robot arm relative to the object support when the robot arm arranges said subsequent object relative to the object support. Advantageously the offset value is taken into account to adjust the position of the object or subsequent objects relative to the ring shaped protrusion with the object handler.

In a further embodiment the object handler further comprises a pre-aligner from which the robot arm receives the subsequent object, wherein the control unit is configured to control the position of said subsequent object relative to the robot arm when the robot arm receives said subsequent object, by controlling the position of the pre-aligner and/or the position of the object on the pre-aligner. Advantageously the robot arm can be configured to keep performing a repetitive action while the position of the object is adjusted by adjusting the pre-aligner.

In an embodiment the processing unit is configured to determine the position of the object relative to the ring shaped protrusion by determining two locations of the ring shaped protrusion and/or two locations of the object. Advantageously the number of measurements needed to be performed is relatively low.

In an embodiment the processing unit is configured to determine the position of the object relative to the ring shaped protrusion by determining three of four locations of the ring shaped protrusion and/or three of four locations of the object. Advantageously the accuracy may be increased, and deviations, e.g. due to manufacturing tolerances, of the radius of the object or the inner or outer radius of the ring shaped protrusion may be compensated for, in particular when four measurements are used.

In an embodiment the sensor module comprises a level sensor. Advantageously height differences, e.g. at an inner or outer radius of the ring shaped protrusion and/or at a radius of the object, can easily be detected with the level sensor. In addition a level sensor may already be provided in the stage apparatus, e.g. to make a height map of the object.

In an embodiment the sensor module comprises an optical sensor. Advantageously using the optical sensor the ring shaped protrusion and the object can be detected. In addition an optical sensor may already be provided in the stage apparatus, e.g. as part of an alignment sensor.

In an embodiment the stage apparatus further comprises a vertical object support positioner configured to position the object support in a direction perpendicular to the first plane, and to position the object support in a focus range of the sensor module in said direction for the sensor to detect the object support. Advantageously the accuracy of the measurement may be improved by arranging the object support in the focus range, e.g. closer to the sensor module.

In an embodiment the stage apparatus further comprises a horizontal object support positioner configured to position the object support in a plane parallel to the first plane, and to position the object support in said plane before the object support is configured to receive a subsequent object, based on the offset value. Advantageously the position of the subsequent object relative to the ring shaped protrusion can be adjusted by positioning the object support.

In an embodiment the stage apparatus comprises an object support positioner which comprises the horizontal object support positioner and the vertical object support positioner.

In an embodiment the object support or an object table further comprises one or more markers configured to be detectable by the sensor module. Advantageously the position of the object support can easily be determined by detecting one or more of the markers.

In a further embodiment the processing unit is configured to determine the position of the object support based on a single marker. Advantageously a single measurement may be sufficient to determine the position of the object support.

In an embodiment the ring shaped protrusion comprises an air seal. Advantageously an at least partial vacuum between the object and the object support can be maintained.

In an embodiment the object is a test object and the stage apparatus comprises said test object. The test object comprises substantially the same radius in the first plane as an object that is to be arranged on the object support, and is semi-transparent for the sensor module, thereby allowing the sensor module to simultaneously detect the object support and the test object, when the test object is arranged on the object support. Advantageously the position of the object relative to the object support can be derived from a single measurement set-up.

In an embodiment the object and/or the subsequent object is a substrate. Advantageously the position of the substrate can be optimized using the invention, thereby e.g. increasing accuracy in the lithographic process.

The invention further relates to a lithographic apparatus comprising a projection system for projecting the pattern onto a substrate, and the stage apparatus according to the invention. Advantageously the position of the substrate in the stage apparatus can be optimized improving the performance of the stage apparatus and the accuracy in the lithographic process.

The invention further relates to a method for calibrating an object loading process, comprising the steps of: detecting an object support comprising a ring shaped protrusion extending in a first plane between an inner radius and an outer radius; arranging an object on the object support, the object having a radius larger than the outer radius of the ring shaped protrusion, and detecting the object when it is arranged on the object support; determining a position of the object relative to the ring shaped protrusion when the object is arranged on the object support; and determining, based on said position of the object, an offset value representing the position of the object relative to the ring shaped protrusion. Advantageously an offset value is determined representing the position of the object relative to the ring shaped protrusion. Based on said offset value the position of the object and/or subsequent objects can be adjusted.

In an embodiment of the method the step of arranging the object on the object support is done with a robot arm, and the method further comprises the step of controlling, based on said offset value, a position of a subsequent object relative to the robot arm when the robot arm receives the subsequent object, and/or a position of the robot arm relative to the object support when the robot arm arranges the subsequent object relative to the object support. Advantageously the offset value is taken into account to adjust the position of the object or subsequent objects relative to the ring shaped protrusion with the object handler.

In an embodiment the method further comprises a step of determining two locations of the ring shaped protrusion and/or two locations of the object, and wherein the step of determining the position of the object relative to the ring shaped protrusion is done based on said locations. Advantageously the number of measurements needed to be performed is relatively low.

In an embodiment the method further comprises a step of determining three or four locations of the ring shaped protrusion and/or three or four locations of the object, and wherein the step of determining the position of the object relative to the ring shaped protrusion is done based on said locations. Advantageously the accuracy is high.

In an embodiment the locations of the ring shaped protrusion and/or the object are determined by detecting a height difference indicating a border of the ring shaped protrusion and/or the object, respectively. Advantageously the ring shaped protrusion and/or object can easily be detected.

In an embodiment the method further comprises a step of determining a position of a marker on an object table or the object support, and/or a marker on the object, wherein the step of determining the position of the object relative to the ring shaped protrusion is done based on said marker. Advantageously the position of the object support can easily be determined by detecting one or more of the markers.

A second aspect of the invention relates to a stage apparatus, comprising: an object support comprising a plurality of burls configured to support the object, and a sensor module comprising a level sensor configured to detect at least one burl of the plurality of burls, and the object when it is arranged on the object support. The stage apparatus further comprises a processing unit configured to receive one or more signals from the sensor module, and to determine, based on said one or more signals, a position of the object relative to the object support when the object is arranged on the object support. The processing unit is further configured to determine, based on said position of the object, an offset value representing the position of the object relative to the object support. Advantageously an offset value is determined, based on which the position of the object and/or subsequent objects relative to the object support can be improved. Advantageously a level sensor is used to detect the burls which may already be present on the stage apparatus, e.g. to make a height map of the object.

In a further embodiment the processing unit is configured to determine the position of the object relative to the object support by determining the position of the object relative to one or more of the burls, e.g. one or more most radially outward burls. In a further embodiment the processing unit may be further configured to determine the offset value such that it represents the position of the object relative to said burls. Advantageously position relative to the burls can be improved.

The second aspect of invention further relates to a method for calibrating an object loading process, comprising the steps of: detecting, with a level sensor, an object support comprising a plurality of burls configured to support an object; arranging an object on the burls of the object support, and detecting, with a level sensor, the object when it is arranged on the object support; determining a position of the object relative to the object support when the object is arranged on the object support; and determining, based on said position of the object, an offset value representing the position of the object relative to the object support. Advantageously an offset value is determined, based on which the position of the object and/or subsequent objects relative to the object support can be improved. Advantageously a level sensor is used to detect the burls. Such a level sensor may already be present on the stage apparatus, e.g. to make a height map of the object.

In a further embodiment the step of determining the position of the object relative to the object support may comprise determining the position of the object relative to one or more of the burls, e.g. one or more most radially outward burls. In a further embodiment the offset value may be determined such that it represents the position of the object relative to said burls. Advantageously, the position of the object relative to the burls can be improved.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
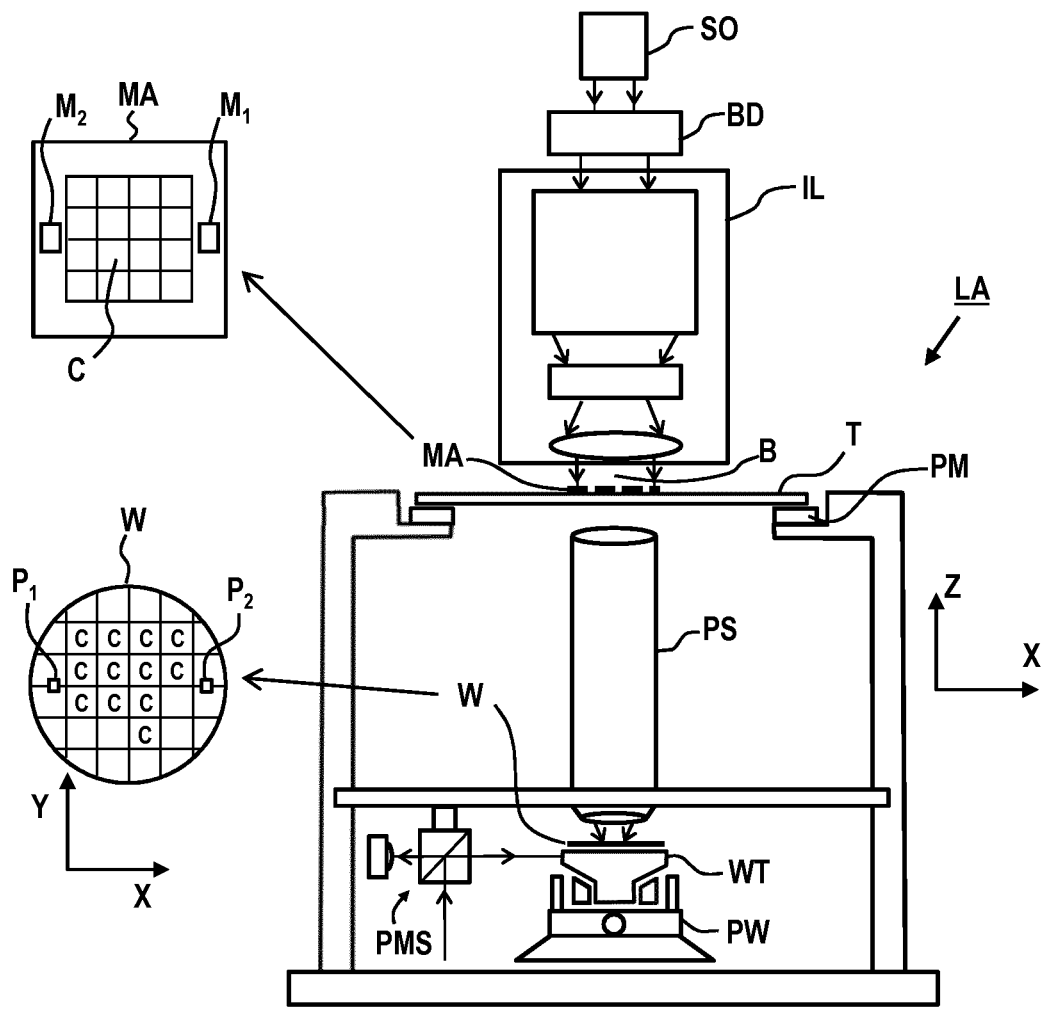
FIG. 1 depicts a schematic overview of a lithographic apparatus.

FIG. 1 schematically depicts a lithographic apparatus LA which may e.g. be embodied according to the invention. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W. The substrate support WT may e.g. be part of a stage apparatus according to the invention.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
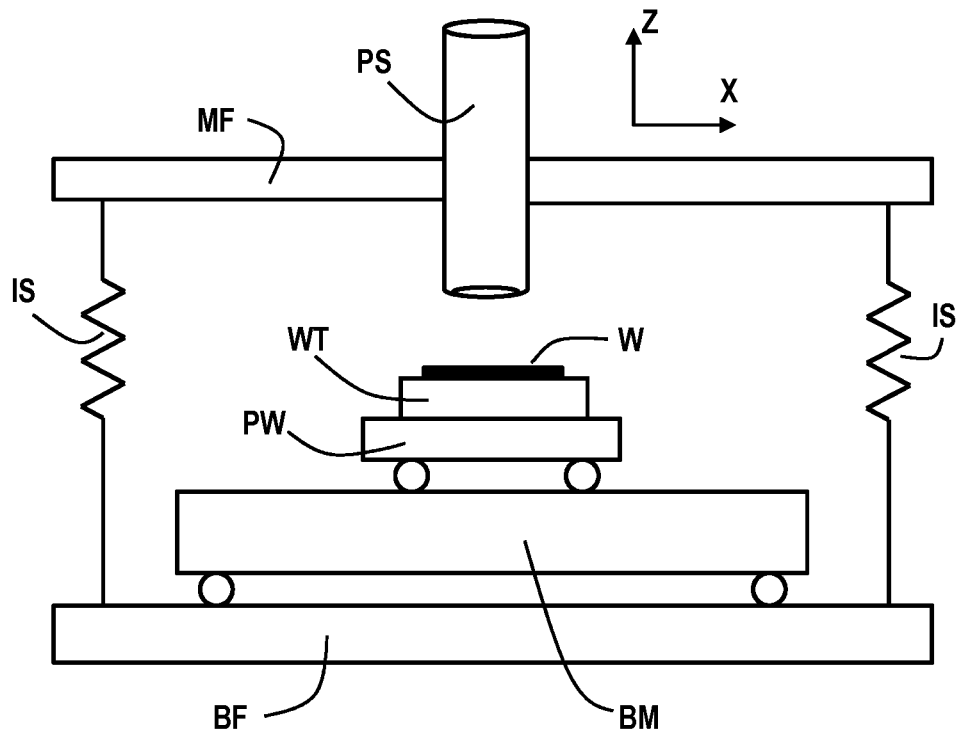
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
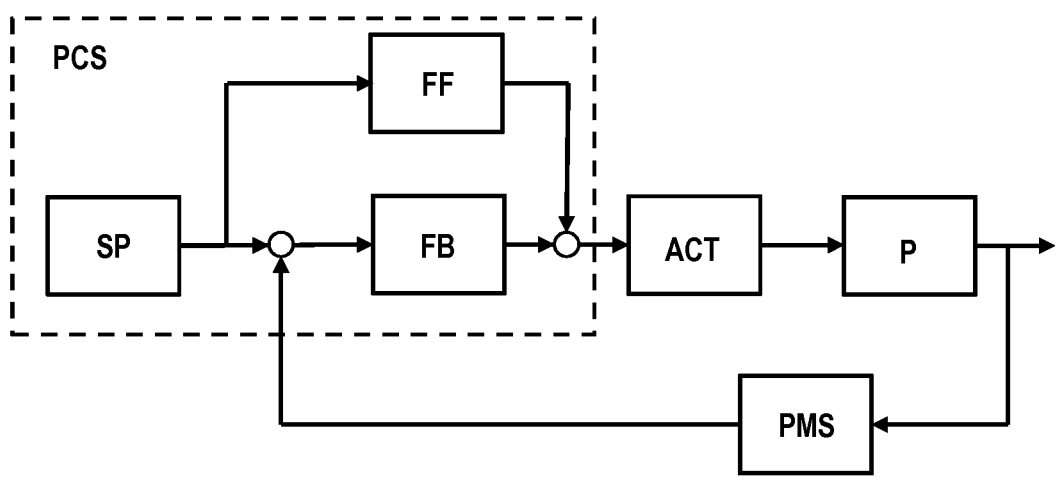
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4A:
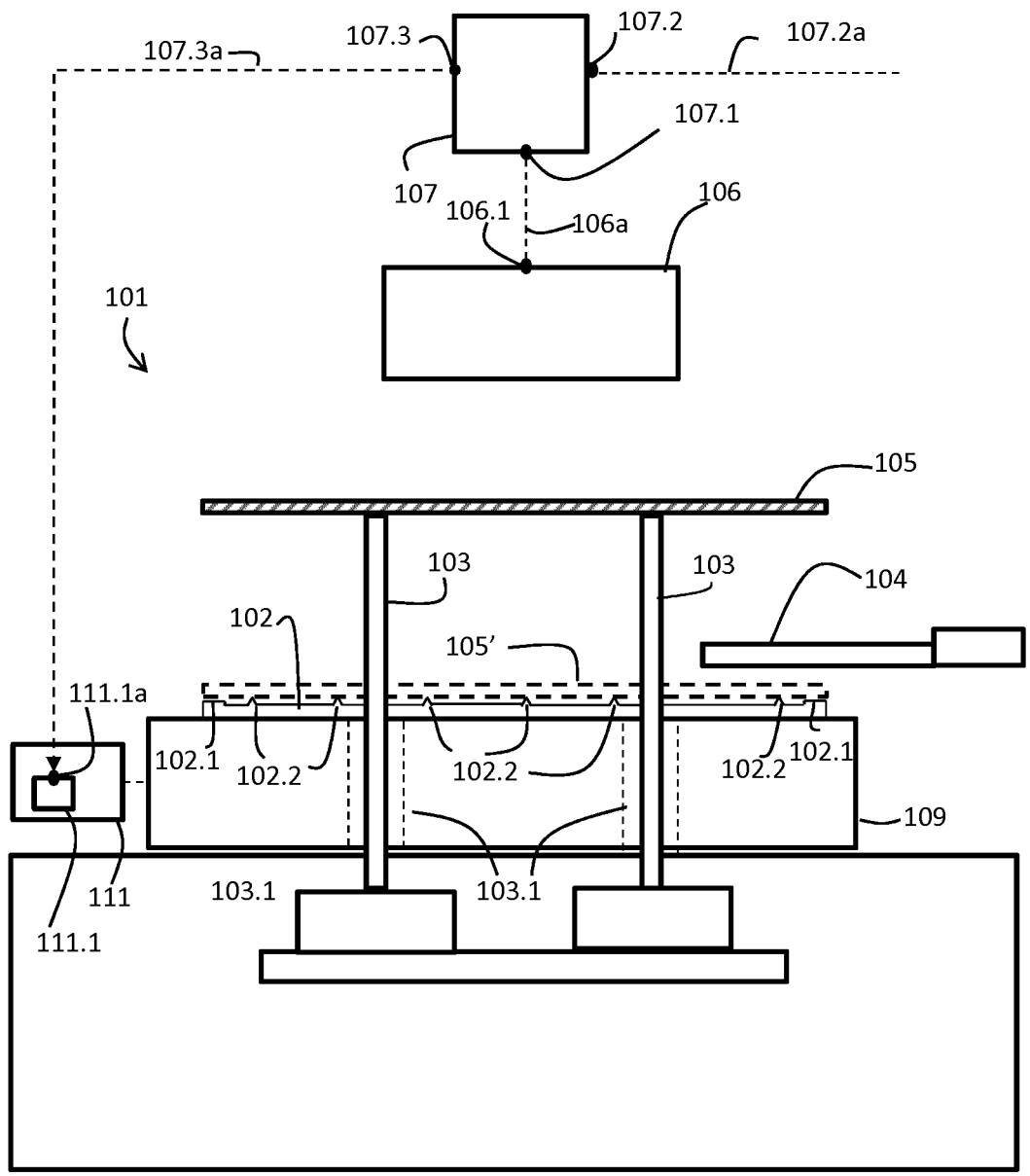
FIG. 4*a* depicts an embodiment of a stage apparatus according to the invention.
Figure 4B:
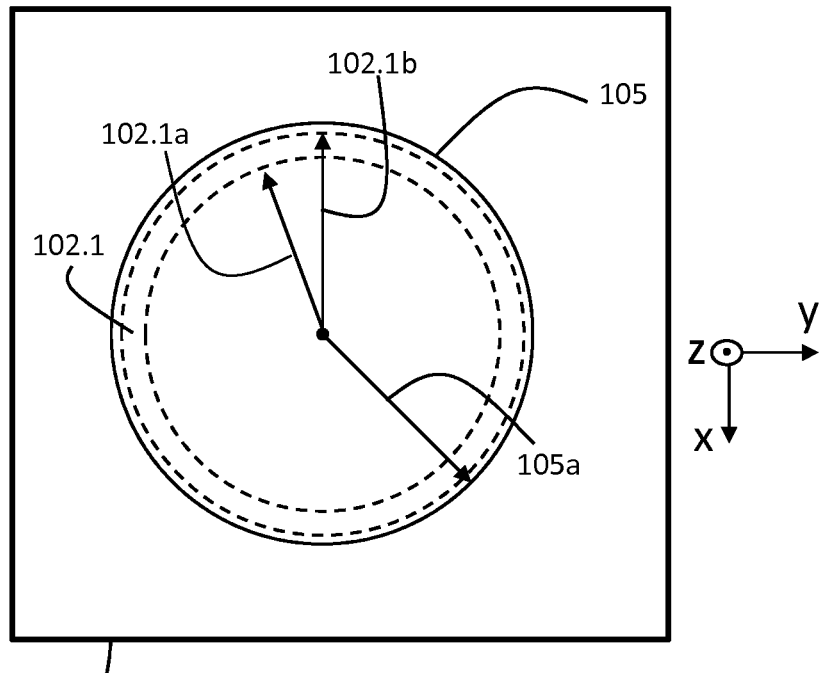
FIG. 4*b* illustrates the object being aligned correctly relative to the ring shaped protrusion.

FIG. 4a shows a side view of a stage apparatus 101 according to the invention which comprises an object support 102 configured to support an object 105, which e.g. is a substrate W. The object support 102 comprises an ring shaped protrusion 102.1, and may e.g. be arranged on an object table 109. FIG. 4b shows a top view which for the sake of clarity only shows the object 105, the object table 109 and the ring shaped protrusion 102.1, which when the object 105 is arranged on the object support is arranged below the object 105. As can be seen in FIG. 4b, the ring shaped protrusion 102.1 has an outer radius 102.1b in a first plane xy and the object 105 has a radius 105a in the first plane xy which is larger than the outer radius 102.1b of the ring shaped protrusion 102.1. FIG. 4b also shows an inner radius 102.1a of the ring shaped protrusion 102.1.

It is noted that in the context of the present invention the radius of the object 105 in the first plane xy is preferably defined as the radius of said object 105 when it is arranged on the object support 102. For example, when the object 105 has an out-of-plane shape it may be arranged more flat on the object support 102, which may result in a larger radius is said situation.

With reference to FIG. 4a an example of how the object 105 may be arranged on the object support 102 is now given. The stage apparatus 101 e.g. comprises a plurality of support members 103 for supporting the object 105, arranged to receive the object 105 from a gripper 104 and to arrange the object 105 on the object support 102 and/or vice versa. The support members 103 are moveable in at least a vertical direction z which is perpendicular to the first plane xy. In the shown embodiment the stage apparatus 101 comprises three support members 103 of which two are visible in the side view shown in FIG. 4a. The three support members 103 are preferably arranged such that when seen in top view an imaginary equilateral triangle can be drawn wherein the support members 103 are situated on the corners. It is noted however that any suitable number of support members 103 may be applied in any suitable arrangement.

Arranging the object 105 on the object support 102 can then e.g. be accomplished as follows. In the situation shown in FIG. 4a the object 105 is supported by the support members 103 and a gripper 104 has been partially retracted. Prior to this situation the object 105 was supported by the gripper 104, which arranged the object 105 above the object support 102 to provide the object 105 to the stage apparatus 101. The gripper 104 may e.g. be driven by a robot, e.g. a multi-axis robot arm, which is part of a handling system that provides the object 105. The support members 103 are then moved vertically upwards from a retracted position wherein they are arranged below the object support 102 to a supporting position shown in FIG. 4a. During said vertically upwards movement the support members 103 engage the object 105. Once the object 105 is supported by the support members 103 the gripper 104 can be retracted to correspond with the situation shown in FIG. 4a. The support members 103 may be arranged on the same height in the vertical direction z, e.g. when the object 105 is substantially flat, such that the object 105 is arranged horizontally. The support members 103 are then moved vertically downwards until the object 105 is arranged on the surface 102.1, as indicated by the dashed lines 105'.

The object 105 can be removed in a similar manner, e.g. after the pattern has been projected on the object 105. While the object 105 is arranged on the object support 102 the support members 103 are in the retracted position below the object support 102. The support members 103 can be moved vertically upwards in the vertical direction z until they engage the object 105, such that the object 105 is supported by the support members 103 instead of the object support 102. The support members 103 can then be further moved vertically upwards in the vertical direction z until they reach the supporting position as shown in FIG. 4a again. The gripper 104 can then be moved below the object 105 to support the object 105. For example, the gripper 104 can be moved vertically upwards after being arranged under the object 105 in order the engage the object. It is also possible to move the support members 103 vertically downwards after the gripper 104 has been arranged below the object 105 until the gripper 104 engages the object 105. It is noted that in an embodiment the gripper used for removal of the object 105 may be a gripper which is different from the gripper 104 used for providing the object 105, e.g. both grippers may be arranged on opposite sides of the object 105, e.g. on the left and right side in FIG. 4a.

In an embodiment, the object support 102 optionally comprises a plurality of burls 102.2. When the object 105 is arranged on the object support 102, in the position as shown by dashed lines 105' in FIG. 4a, the burls 102.2 support the object 105. Optionally the burls 102.2 extend further upwards in the vertical direction z than the ring shaped protrusion 102.1, such that the object 105 is not in contact with the ring shaped protrusion 102.1.

In an embodiment, at least partial vacuum, e.g. between vacuum and the pressure surrounding the stage apparatus, is provided between the object 105 and the object support 102 to exert a clamping force on the object 105 to maintain the object 105 in a fixed position relative to the object support 102. Optionally the ring shaped protrusion 102.1 comprises an air seal configured to maintain said partial vacuum between the object 105 and the object support 102 when the object 105 is arranged on the object support 102. Optionally the object 105 and the ring shaped protrusion 102.1 are not in contact with each other, such that air can flow in through an opening between them.

Whereas traditionally objects 105 such as substrates W were substantially flat, like the object 105 shown in FIG. 4a, recently more often substrates with out-of-plane shapes, e.g. warped or curved, are to be processed. However once arranged on the object support 102 said objects 105 are preferably as flat as possible, e.g. to minimize overlay and errors in the exposed pattern which can result from the out-of-plane shape, and which may be unpredictable as it varies from object to object. One solution for this is to arrange one or more of the burls 102.2 further radially outward, such that a larger part of the object 105 is supported in a controlled manner, i.e. by the burls 102.2.

Figure 4C:
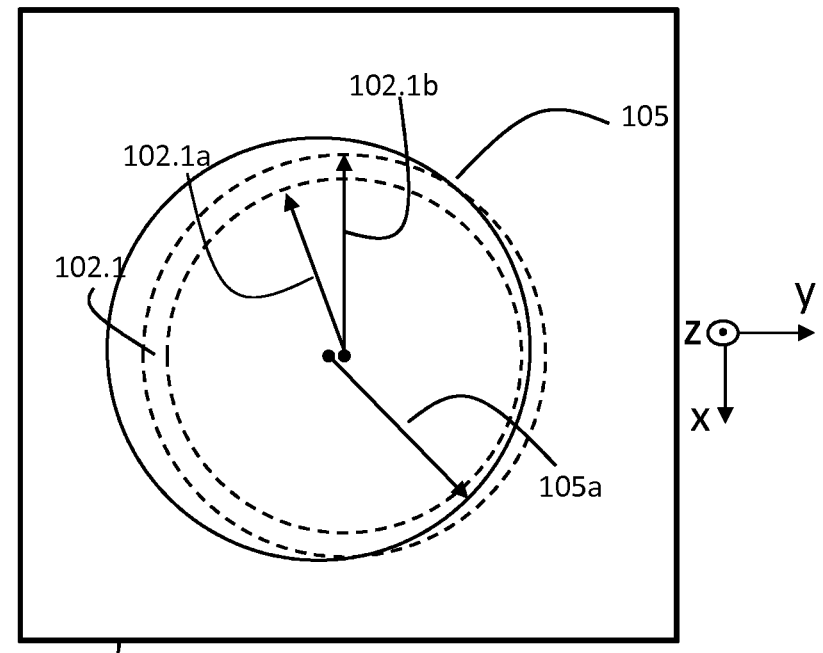
FIG. 4*c* illustrates the object being aligned incorrectly relative to the ring shaped protrusion.

To provide space for said further outwardly arranged burl or burls 102.2, the ring shaped protrusion 102.1 may also be arranged further outward, i.e. the outer radius of the ring shaped protrusion 102.1 may be increased. A situation as shown in FIG. 4c may than occur, for example because the difference between the outer radius 102.1b of the circumferential protrusion 102.1 and the radius 105a of the object 105 has become smaller. Due to the manufacturing and process tolerances a misalignment between the object 105 and the ring shaped protrusion 102.1 may then occur wherein the ring shaped protrusion 102 is not arranged completely below the object 105. In such situation the correct functioning of some components may no longer be guaranteed, e.g. the air seal of the ring shaped protrusion 102.1 may not function correctly. This may result in unsuccessful clamping of the object 105. Even if the clamping itself is still successful, it may result in curling of the object 105 because the clamping force may not be sufficient to hold the object 105 in a substantially flat state during clamping.

The stage apparatus 101 according to the invention therefore comprises a sensor module 106 which is schematically shown in FIG. 4a. The sensor module 106 is configured to detect the object support 102, and the object 105 when it is arranged on the object support 102. A processing unit 107 is configured to receive one or more signals 106a from the sensor module 106, in the shown embodiment via output terminal 106.1 and input terminal 107.1. Based on said one or more signals 106a, the processing unit 107 is configured to determine a position of the object 105 relative to the ring shaped protrusion 102.1 when the object 105 is arranged on the object support 102. The processing unit 107 is further configured to determine, based on said position of the object 105, an offset value representing the position of the object 105 relative to the ring shaped protrusion 102.1.

The invention thus provides in a stage apparatus which determines an offset value representing the position of the object 105 relative to the ring shaped protrusion 102.1. Said offset value can be used to adjust the position of the object 105 or subsequent objects relative to the object support 102 and/or similar objects which are to be arranged on the object support 102. As such a situation as shown in FIG. 4c can be prevented. The invention may in particular be advantageous if a large number of objects 105 with the same or at least a very similar radius 105a are to be processed, which is usually the case in a lithographic process. A first object 105 or a test object with the same radius 105a may then be used to determine the offset value and all the subsequent objects may then be positioned accordingly. Said first object 105 or test object in this embodiment is used to calibrate the stage apparatus. Of course, for subsequent objects the offset value may still be determined, e.g. the objects following said first object until the offset value for a given object is below a threshold value, and/or periodically in a given time period or after a given number of processed objects. The offset value may as such be corrected.

In an embodiment as is e.g. shown in FIG. 4a, the sensor module 106 is configured to detect the object support 102 when no object 105 is arranged on the object support 105. For example, the sensor module 106 may detect the object support 102 before the object 105 is arranged on it or after the object 105 has been removed from it. Since the object 105 is arranged over the ring shaped protrusion 102.1 when the object 105 is arranged correctly on the object support 102, the ring shaped protrusion 102.1 may not be detectable from above in this situation. By detecting the object support 102 before or after said situation occurs, this embodiment allows to use relatively simple sensors in the sensor module 106 which can practically be arranged above the object support 102. Optionally the processing unit 107 is configured to match a measurement of the object 105 and a measurement of the object support 102 based on a position of an object support positioner when each of the measurements have been performed.

Figure 5:
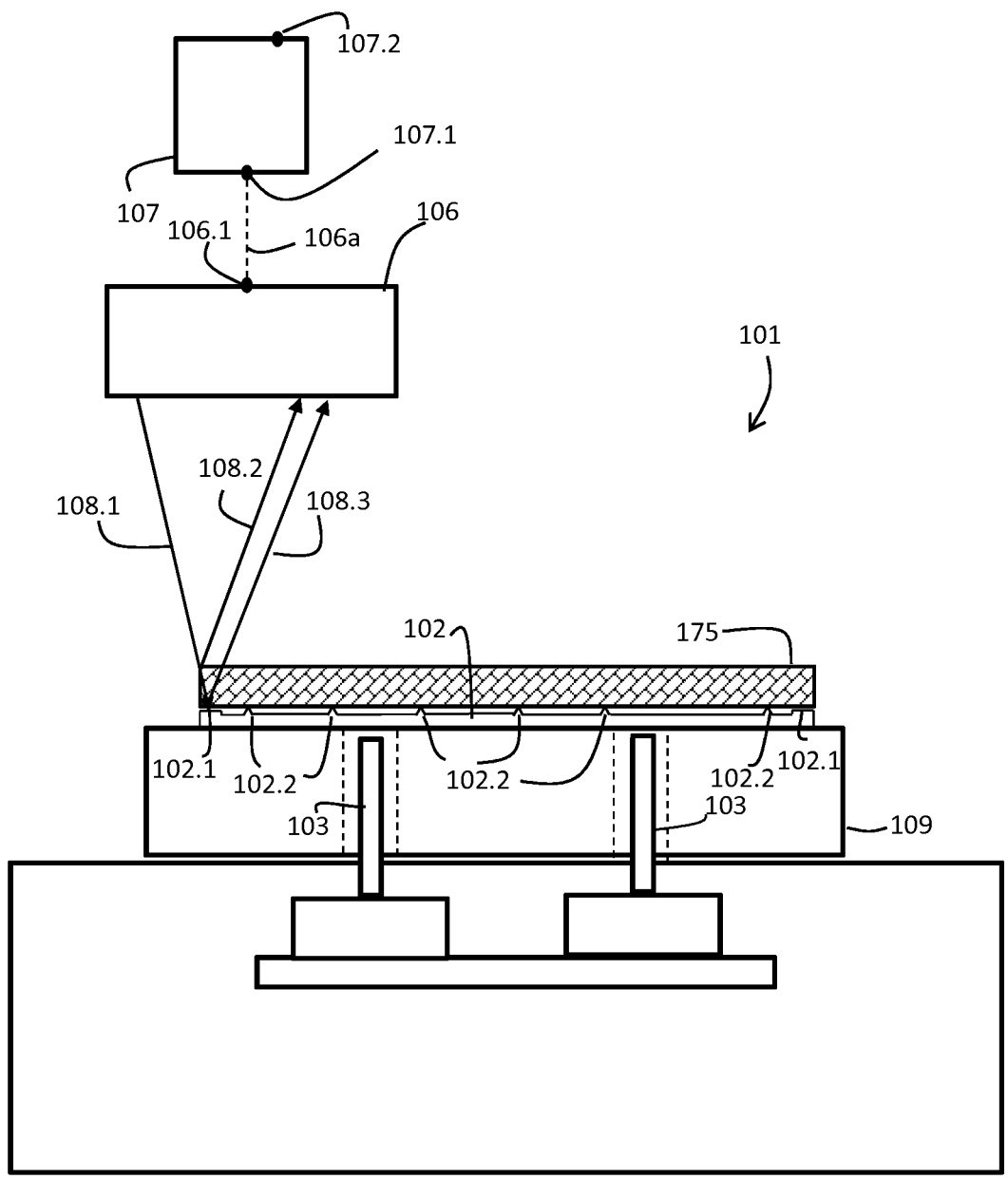
FIG. 5 depicts an embodiment of the invention comprising a test object.
Figure 5:
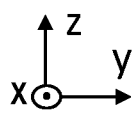

FIG. 5 depicts an embodiment wherein the object is a test object 175 and wherein the stage apparatus 101 comprises said test object 175. The test object 175 comprises substantially the same radius as the object that is to be arranged on the object support 102. The test object 175 is semi-transparent for the sensor module 106. This allows the sensor module 106 to simultaneously detect the object support 102 and the test object 175, when the test object 175 is arranged on the object support 102. The processing unit 107 may then be configured to determine the offset value with the test object 175 as object.

In this embodiment the test object 175 enables calibrating of the stage apparatus by detecting the test object 175 and the object support 102 at the same time. This eliminates the need to match two or more and separately perform measurements to each other, e.g. of the object support 102 and of the object. For example, the test object 175 may be of a material that partly reflects a measurement beam 108.1 transmitted by sensor module 106 as a first reflected beam 108.2 and partly lets the measurement beam 108.1 through, such that a part is reflected by the object support 102 as a second reflected beam 108.3.

For example, the sensor module 106 may be configured to emit multiple measurement beams, e.g. of different wavelengths, of which at least one is reflected by the object or test object 175 and at least one propagates through the object or test object 175, i.e. the object or test object 175 being transparent for said measurement beam. For example, the sensor module 106 may comprise multiple types of sensors, comprising at least one which detects the object or test object 175 and at least one which detects the object support 102 or the ring shaped protrusion 102.1 while the object or test object is arranged above it. It is noted that some of these embodiments may also be applied with normal objects. In an embodiment the test object 175 may further comprise one or more markers which are detectable for the sensor module 106.

In an embodiment, e.g. as shown in FIG. 4a, the processing unit 107 comprises a first output terminal 107.2 configured to output the offset value, e.g. with offset signal 107.2a, to a control unit of an object handler, e.g. comprising the gripper 104.

Figure 6:
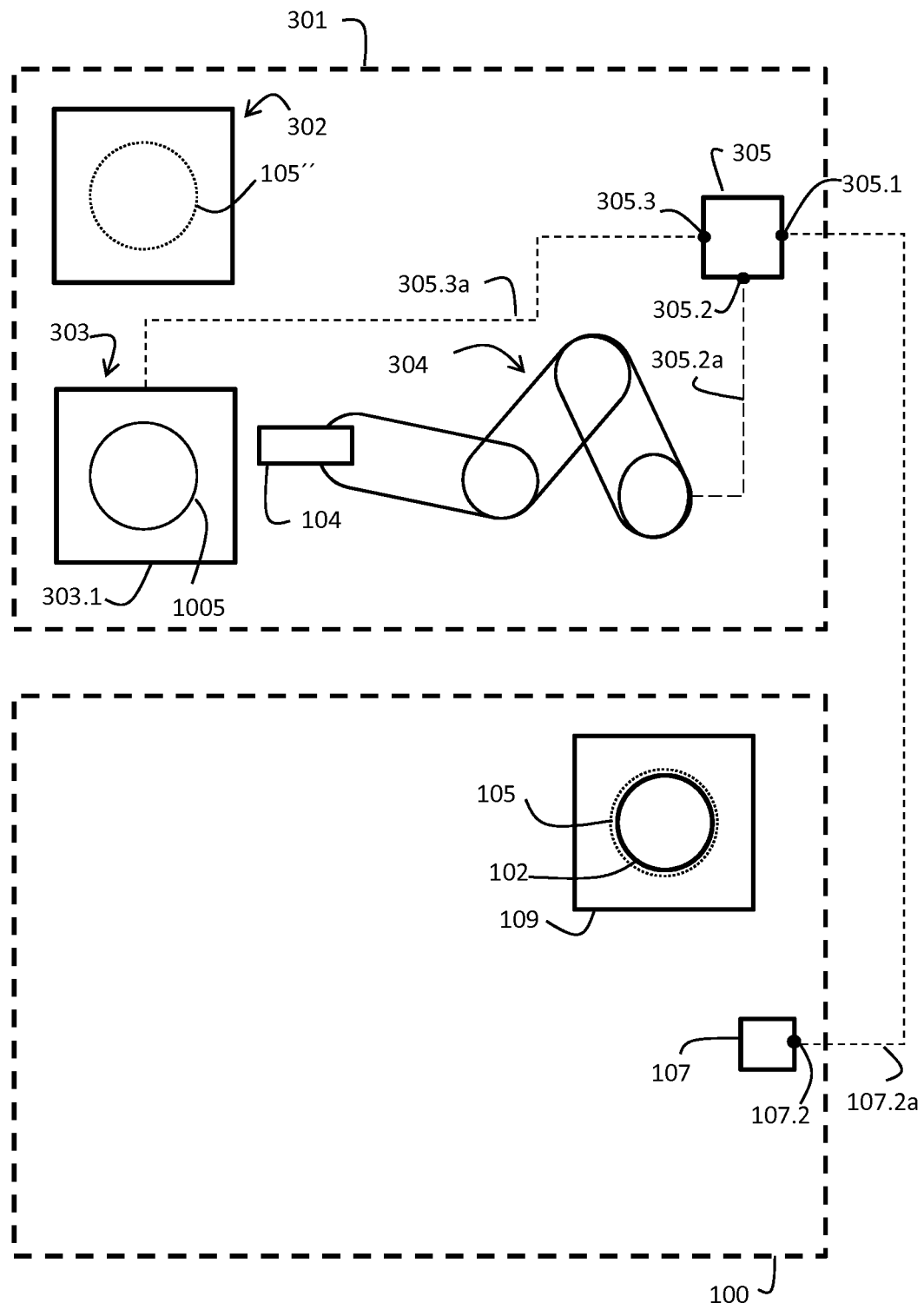
FIG. 6 depicts an object handler.

FIG. 6 shows an embodiment of an object handler 301 which the stage apparatus in an embodiment comprises. It is noted that for the sake of clarity FIG. 6 does not depict all components, but focuses on those relevant for the explanation that follows. The object handler 301 comprises a robot arm 304, configured to provide a subsequent object 1005 to the object support 102, and a control unit 305. The control unit 305 is configured to, based on said offset value, control a position of the subsequent object 1005 relative to the robot arm 304 when the robot arm 304 receives the subsequent object 1005, and/or a position of the robot arm 304 relative to the object support 102 when the robot arm arranges the subsequent object 1005 relative to the object support 105. In this embodiment the control unit 305 as such controls the position of the subsequent object 1005 relative to the ring shaped protrusion when the subsequent object 1005 is arranged on the object support 102.

In a further embodiment the object handler 301 further comprises a pre-aligner 303 from which the robot arm 304 receives the subsequent object 1005, wherein the control unit 305 is configured to control the position of said subsequent object 1005 relative to the robot arm 304 when the robot arm 304 receives said subsequent object 1005, by controlling the position of the pre-aligner 303 and/or the position of the object 1005 on the pre-aligner 303.

In the shown embodiment the object handler 301 comprises the pre-aligner 303 on which the subsequent object 1005 is pre-aligned before the robot arm 304 receives the subsequent object 1005. The pre-aligner 303 may e.g. comprise an object table 303.1, and e.g. members (not shown) similar to the support members that arranged the object 105 on the object support 102. In the shown embodiment the object handler 301 further comprises an optional thermal conditioner 302 on which the subsequent object 1005 may be arranged on the location indicated by reference sign 105". In the shown embodiment the object support 102 is further arranged in a measurement stage 100.

In the shown embodiment the control unit 305 receives the offset signal 107.2a from the processing unit 107. FIG. 6 further shows that the control unit 305 has a first output terminal 305.2 for controlling the robot arm 304 with a first control signal 305.2a. The robot arm 304 comprises the gripper 104, and the position of the gripper 104 can thus be controlled as such. Since the gripper 104 arranges the subsequent object 1005 above the object support 102 for the support members to engage the subsequent object 1005, the position of the subsequent object 1005 relative to the ring shaped protrusion can be controlled as such. The robot arm 304 may further be able to repeat its movement repetitively with high precision, such that each subsequent object 1005 can be arranged on substantially the same position relative to the object support 102.

In addition the control unit 305 has an optional second output terminal 305.3 for controlling the pre-aligner 303 with a second control signal 305.2a. Based on the second control signal 305.2a, the position of the pre-aligner 303 and/or the position of the subsequent object 1005 on the pre-aligner 303 may be adapted. As such the position of the subsequent object 1005 relative to the robot arm 304 when the robot arm 304 receives the subsequent object 1005 can be adjusted, and the robot arm 304 therefore arranges the subsequent object 1005 on an adjusted position relative to the object support 102. It is noted that in an embodiment the pre-aligner 303 and the robot arm 304 may be controlled by two physically and/or functionally separated control units.

In an embodiment as is e.g. shown in FIG. 4a, the processing unit 107 comprises a second output terminal 107.3 configured to output the offset value to a control unit 111.1 of a horizontal object support positioner 111, e.g. with an offset signal 107.3a via an input terminal 111.1a. The horizontal object support positioner 111, which is schematically depicted in FIG. 4a, is configured to position the object support 102 in a plane parallel to the first plane xy and to position the object support 102 in said plane before the object support 102 is configured to receive a subsequent object, based on the offset value. Based on the offset value, the position of the object support 102 can be adjusted, e.g. for subsequent objects 105, such that the alignment of said objects 105 with the ring shaped protrusion 102.1 is as desired. For example, the position of the object support 102 at the moment that the support members 103 engage the object 105 can be adjusted. It is noted that in an embodiment the first output terminal 107.2 and the second output terminal 107.3 may be embodied as a single output terminal.

In an embodiment, the object support 102 may be a substrate support WT as shown in FIGS. 1-2, and the horizontal object support positioner may be the second positioner as described herein with reference to those figures. The offset value e.g. may be used in the position control system PCS illustrated in FIG. 3, e.g. in the setpoint generator SP. Optionally the positioning of the object support based on the offset value may be done with the short-stroke module, or with the long-stroke module.

In an embodiment, e.g. shown in FIG. 4a, the support members 103 may be moveable in the first plane xy by the long-stroke module. For example, the object table 109 may comprise holes 103.1 for the support members 103 to extend through in the vertical direction z, which are preferably large enough for the object table 109 to be moved in the first plane xy by the short-stroke module. In a further embodiment the position of the object 105 relative to the object support 102 may be controlled by controlling the position of support members 103 relative to the object support 102 and/or object table 109, e.g. by controlling the short-stroke module relative to the long-stroke module.

Figure 7A:
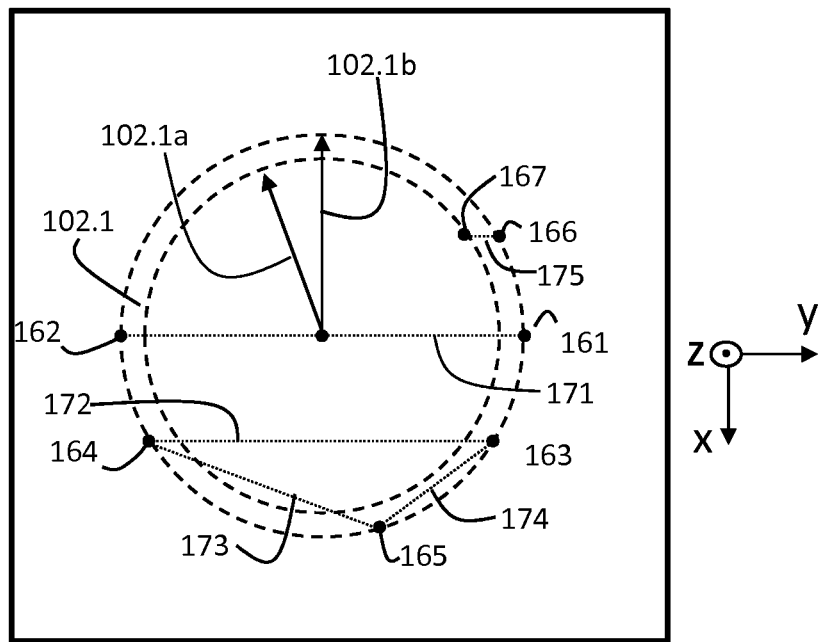
FIG. 7*a* illustrates various ways of determining the position of the ring shaped protrusion.

FIG. 7a illustrates how the position of the ring shaped protrusion 102.1 may be determined. In an embodiment, the processing unit 107 is configured to determine the position of the object 105 relative to the ring shaped protrusion 102.1 by determining two locations of the ring shaped protrusion 102.1 and/or two locations of the object 105. Since the inner radius 102.1a and the outer radius 102.1b of the ring shaped protrusion 102.1 are known, the position of the ring shaped protrusion 102 can be determined when two location are known.

For example, the object support may be moved linearly in one direction y, and the processing unit may be configured to detect a change of height in the vertical direction z which indicates a begin or end of the ring shaped protrusion 102.1. A position of a detected location and/or a distance between two detected locations may e.g. be determined or matched based on a position of object support positioner when such measurement is performed.

For example, two such locations at the outer radius 102.1b may be determined. For example, location 161 and location 162 indicated in FIG. 7a may be detected. The distance 171 between them can be determined, which corresponds with the outer diameter, i.e. twice the outer radius 102.1b, of the ring shaped protrusion 102.1. As such the position of the ring shaped protrusion can be determined.

For example, in an embodiment the sensor module may be configured to detect the ring shaped protrusion at locations further from the centerline of the ring shaped protrusion 102.1. For example, the object support may be moved linearly in one direction y and the sensor module may be configured to detect location 163 and location 164. Since a distance 172 between them is known, it can easily be determined that the position of the ring shaped protrusion 102.1 deviates when a measured distance deviates from distance 172. In this embodiment, it can than easily be determined in which direction and how much the position of the ring shaped protrusion 102.1 deviates based on whether and how much the measured distance is bigger or smaller than distance 172. Said the measured distance increases if the position of the ring shaped protrusion is lower in FIG. 7a, and increase if the position of the ring shaped protrusion is higher in FIG. 7a.

The position of the ring shaped protrusion 102.1 can also be determined from by detecting a location, e.g. location 166, at the outer radius 102.1b and a location, e.g. location 167, at the inner radius 102.1a of the ring shaped protrusion 102.1. A distance 175 between them is known and the same principles apply as explained above with reference to locations 163, 164 and distance 172. Advantageously in this embodiment, a smaller movement of the object support is required.

Alternatively it is possible to detect three locations of the ring shaped protrusion 102.1 which are not on a single straight line, e.g. three locations at the outer radius 102.1b or at the inner radius 102.1a. For example, locations 163, 164 and 165 may be detected. From said three locations 163, 164 and 165 it is always possible to reconstruct the entire ring shaped protrusion 102.1 when it is circular and the outer radius 102.1b and/or inner radius 102.1a are known.

In an embodiment three or four locations of the ring shaped protrusion 102.1 are detected, e.g. three or four out of locations 161, 162, 163, 164, 165, 166, 167. The accuracy of the measurement can as such be relatively high while the number of required measurements is relatively low. In addition deviations, e.g. due to manufacturing tolerances, of can be compensated for.

In an embodiment, it may be assumed that the object support is not rotated around the vertical axis z. That is, deviations of the position of the object support and the ring shaped protrusion 102.1 are only in the direction x and/or direction y. This simplifies the determination of the position of the ring shaped protrusion and reduces the required detected locations.

In an embodiment the processing unit may be configured to determine a rotation around the axis z perpendicular to the first plane xy of the ring shaped protrusion 102.1 and/or of the object 105. Such rotation may e.g. be derived from a marker or a notch, e.g. from the distance between two recognizable locations, e.g. two locations at which there is a height difference.

Figure 7B:
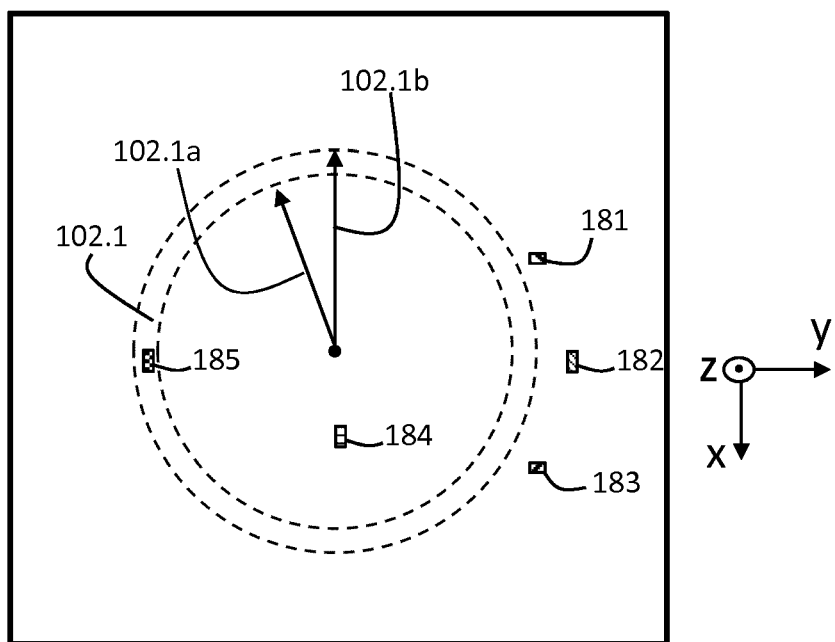
FIG. 7*b* depicts an object support comprising markers.

FIG. 7b illustrates an embodiment wherein the object table 109 further comprises one or more markers 181, 182, 183 configured to be detectable by the sensor module. Optionally the processing unit is configured to determine the position of the object support based on a single marker 181, 182, 183. In an embodiment the object support 102 comprises one or more markers 184 within the ring shaped protrusion 102.1. In an embodiment the ring shaped protrusion 102.1 comprises one or more markers 185.

When one of the markers 181, 182, 183, 184, 185 is detected and recognized, the processing unit can determine which part of the object table 109 is detected. It may further be possible to assume that rotation around the vertical axis z of the object table 109 and the object support 102 does not occur or can be neglected. The position of the ring shaped protrusion 102.1 relative to the detected marker 181, 182, 183, 184, 185 is then known and as such the position of the ring shaped protrusion 102.1 can be determined by only detecting a single marker 181, 182, 183, 184, 185. The markers 181, 182, 183, 184, 185 may e.g. comprise a height profile comprising variations in the vertical direction z which is detectable by the sensor module.

It is noted that the position of the object may be determined similarly to the ways described above with respect to the ring shaped protrusion 102.1. In particular, a height difference representing a border at the radius of the object may be detected. Multiple of such locations, e.g. two or three, can be detected and the position of the object can be derived therefrom. It is also possible to provide one or more markers on the object.

Figure 8A:
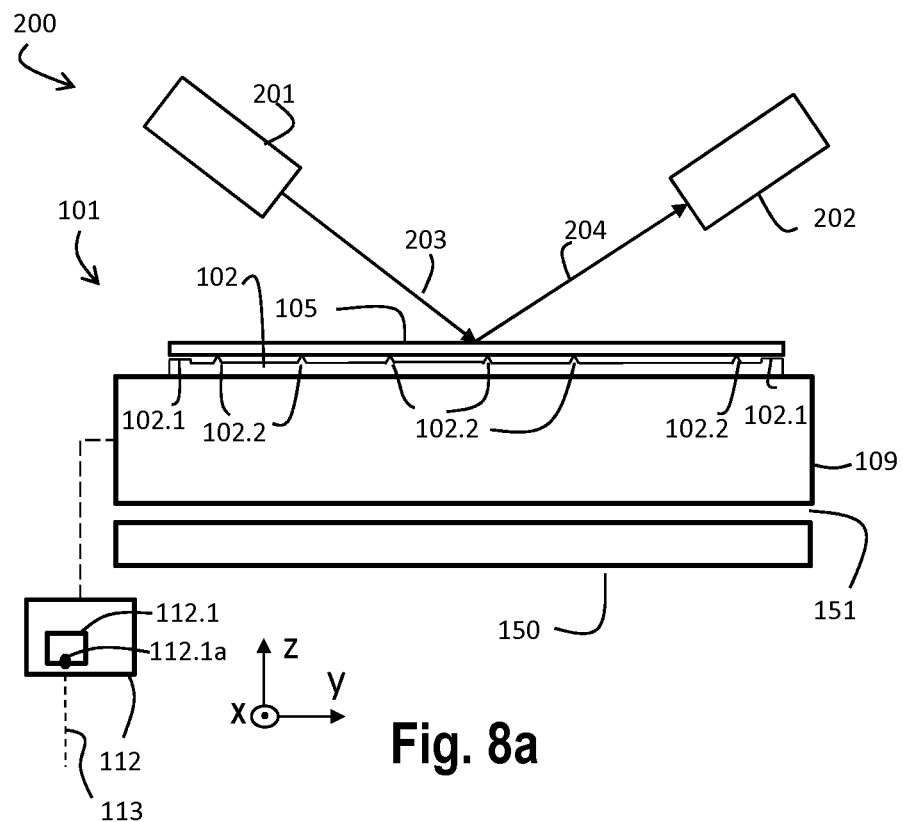
FIGS. 8*a*-8*b* depict an embodiment wherein the sensor module comprises a level sensor, as well as a stage apparatus according to the second aspect of the invention.

FIG. 8a illustrates an embodiment wherein the sensor module comprises a level sensor 200. The use of the level sensor 200 may be advantageous because the level sensor 200 may already be present in the stage apparatus 101, e.g. to make a height map of the object 105 which e.g. is used to correctly project the pattern on the object 105. The level sensor 200 is configured to determine a height in vertical direction z of the object 105 or object support 102 at a certain location in the first plane xy. This allows in particular to detect differences in height, which e.g. indicate the inner or outer radius of the ring shaped protrusion 102.1 or the radius of the object 105.

In the shown embodiment the level sensor 200 comprises a transmitter 201 configured to transmit a measurement beam 203 and a receiver 202 configured to receive a reflected beam 204, the reflected beam 204 comprising radiation of the measurement beam 203 which is reflected by the object 105 and/or the object support 102. Based on the reflected beam 204 the height at which the measurement beam 203 has been reflected can be determined, and as such the height of the object 105 or object support 102.

Figure 8B:
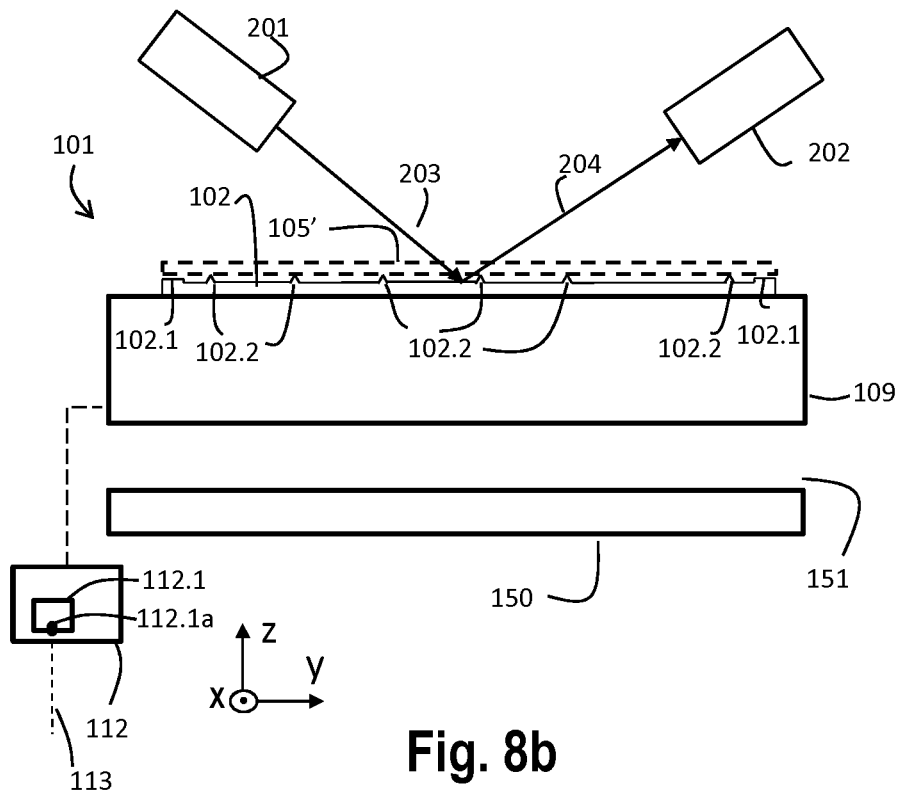

In the shown embodiment the stage apparatus 101 further comprises a vertical object support positioner 112 which is schematically depicted in FIG. 8a. The vertical object support positioner 112 is configured to position the object support 102 in a direction z perpendicular to the first plane xy, and to position the object support 102 in a focus range of the sensor module in said direction z for the sensor module to detect the object support 102. The focus range reflects the range in which a measurement can be performed with the sensor module with a sufficiently high accuracy for the purpose. FIG. 8b illustrates a situation wherein the object support 102 is arranged closer to the sensor module. By arranging the object support 102 closer to the sensor module the object support is arranged in the focus range of the sensor module and the accuracy of this measurement may be improved. In particular when the sensor module comprises a level sensor 200 as shown in FIG. 8a-8b this may be advantageous, since such level sensor 200 may have a relatively small focus range in the direction z wherein accurate measurements can be obtained, which may e.g. be at the height where normally the object 105 is arranged because said level sensor 200 may normally be used to make a height map of said object.

In the shown embodiment the vertical object support positioner 112 comprises a processing unit 112.1 with an input terminal 112.1a to receive a command signal 113, e.g. from the processing unit of the stage apparatus 101 and/or sensor module. In an embodiment, the object support 102 may be a substrate support WT as shown in FIGS. 1-2, and the vertical object support positioner may be the second positioner as described herein with reference to those figures. The command signal to position the object table 102 closer to the sensor module may e.g. be used in the position control system PCS illustrated in FIG. 3, e.g. in the setpoint generator SP. Optionally the positioning of the object support based on the offset value may be done with the short-stroke module or with the long-stroke module. In an embodiment the stage apparatus may comprises an object support positioner which comprises the horizontal object support positioner 111 shown in FIG. 4a and the vertical object support positioner 112 shown in FIG. 8a-8b.

Figure 9:
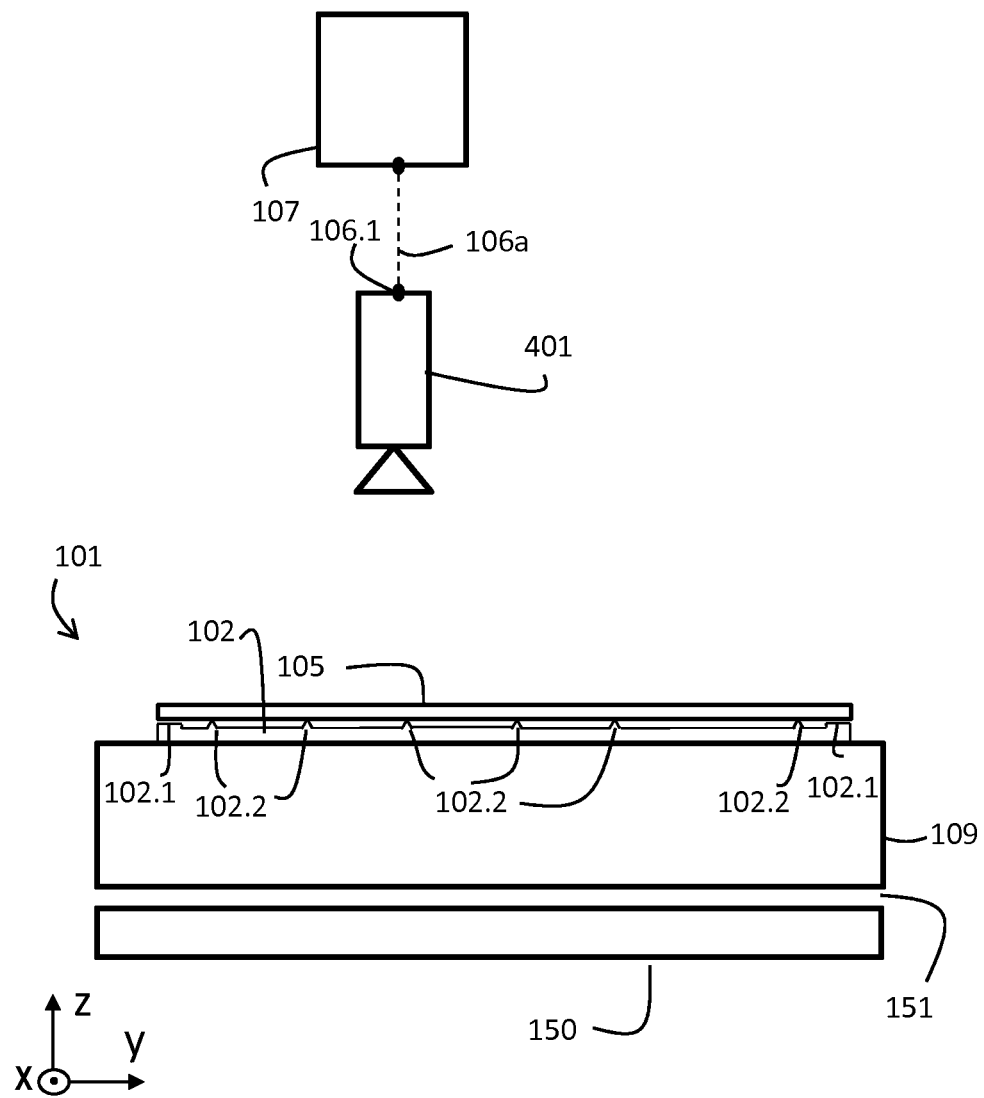
FIG. 9 depicts an embodiment wherein the sensor module comprises an optical sensor.

FIG. 9 illustrates an embodiment wherein the sensor module comprises an optical sensor 401. The optical sensor 401 may e.g. be configured to capture one or more images of the object table 102 and/or the object 105, and the processing unit 107 may be configured to determine the position of the object 105 relative to the ring shaped protrusion 102.1 when the object 105 is arranged on the object support 102 based on said images. For example, the inner and/or outer radius of the ring shaped protrusion 102.1 may be determined from said images, as well as the radius of the object 105. In an embodiment the optical sensor may be a sensor which is also applied for other purposes, e.g. an alignment sensor, e.g. a camera from the alignment sensor. In an embodiment the optical sensor 401 comprises a ccd image sensor.

In an embodiment the object 105 is a substrate, which may e.g. be subject to a lithographic process as explained herein with reference to FIGS. 1-3 and its corresponding description.

The invention further relates to a lithographic apparatus, which may e.g. comprise one or more of the features and components of the lithographic apparatus LA described with reference to FIGS. 1-3 and its corresponding description.

In particular the lithographic apparatus LA according to the invention comprises a projection system PS for projecting a pattern on a substrate W, and the stage apparatus according to the invention. For example, the object support of the stage apparatus according to the invention may be configured to support the substrate W. For example, substrate support WT of the lithographic apparatus LA shown in FIGS. 1-2 may be embodied as the object support of the stage apparatus according to the invention.

Figure 10:
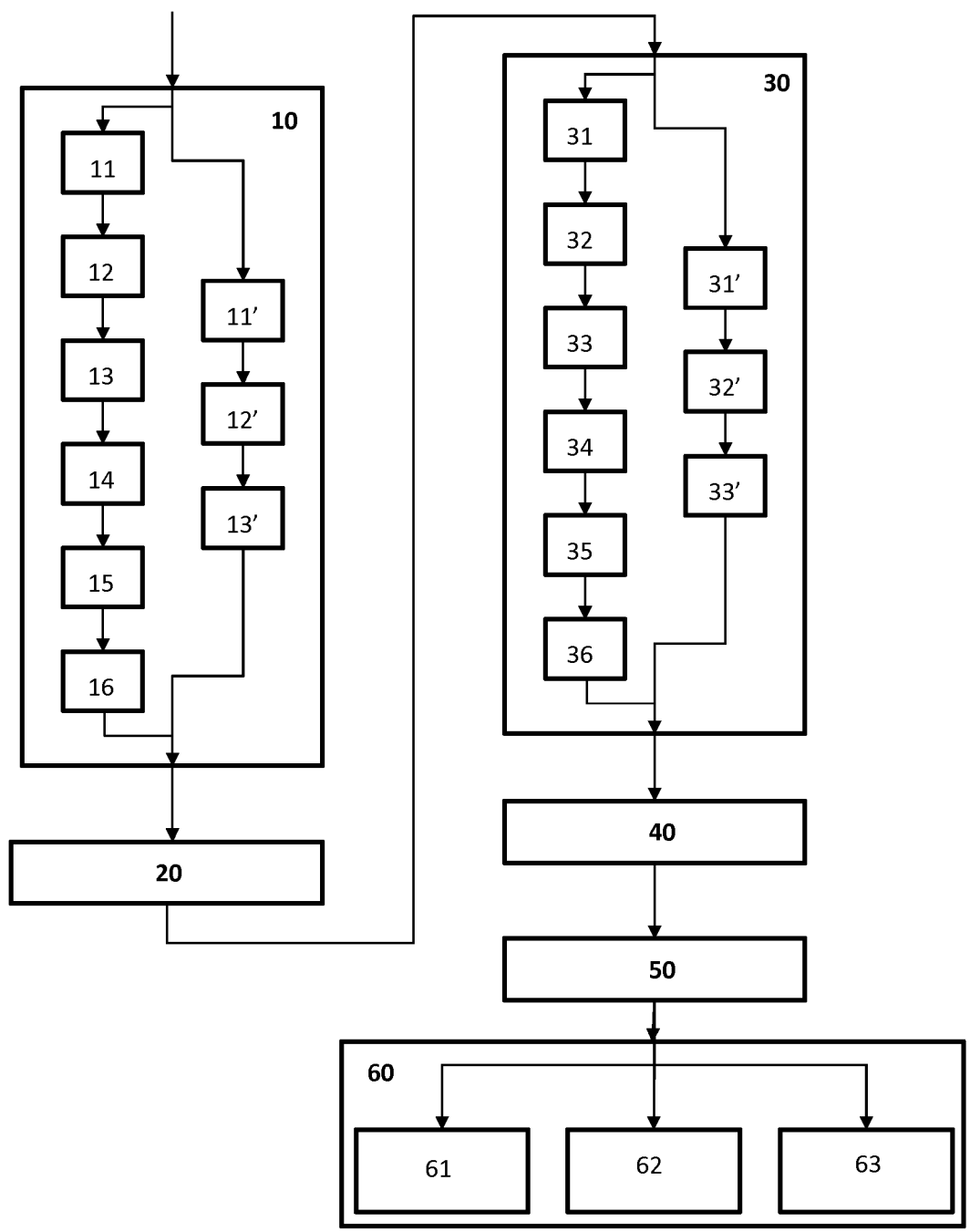
FIG. 10 illustrates an embodiment of the method according to the invention.

FIG. 10 illustrates an embodiment of the method according to the invention. The method may in an embodiment be performed with the stage apparatus according to the invention. Furthermore any of the features described with respect to the stage apparatus, as well as any of the ways of using said stage apparatus, may be added to the method according to the invention and vice versa.

In the shown embodiment, the method comprises a first step 10 of detecting an object support comprising an ring shaped protrusion extending in a first plane between an inner radius and an outer radius. Thereafter the method comprises a second step 20 of arranging an object on the object support, the object having a radius larger than the outer radius of the ring shaped protrusion, and a third step 30 of detecting the object when it is arranged on the object support. A fourth step 40 entails determining a position of the object relative to the ring shaped protrusion when the object is arranged on the object support and a fifth step 50 relates to determining, based on said position of the object, an offset value representing the position of the object relative to the ring shaped protrusion. It is noted however that it is possible to perform the second step 20 and the third step 30 before the first step 10, i.e. first detect the object and thereafter detect the object support. It is also possible to combine the first step 10 and the third step 30, i.e. detect the object and the object support in the same step.

The invention thus provides in a method in which an offset value is determined. Based on said offset value the position of the object and/or subsequent objects relative to the ring shaped protrusion can be controlled, e.g. in an sixth step 60.

For example, in an embodiment the second step 20 of arranging the object on the object support is done with a robot arm. In this embodiment the method further comprises, e.g. in the sixth step 60, a step 61 of controlling, based on said offset value a position of the object and/or a subsequent object relative to the robot arm when the robot arm receives the object or subsequent object, and/or a step 62 of controlling, based on said offset value, a position of the robot arm relative to the object support when the robot arm arranges the object or subsequent object relative to the object support, e.g. for the support members to engage the object or subsequent object.

For example, in an embodiment the method may comprises, e.g. the sixth step 60, a step 63 of controlling, based on said offset value, a position of the object support when the object support is configured to receive the object or subsequent object. This may e.g. be done by controlling a position of support members relative to the object and/or subsequent object, and/or by controlling a position of the object support relative to the support members.

In an embodiment the method comprises a step of determining two locations of the ring shaped protrusion and/or two locations of the object, and the fourth step 40 of determining the position of the object relative to the ring shaped protrusion is done based on said locations. In a further embodiment the locations of the ring shaped protrusion and/or the object are determined by detecting a height difference indicating a border of the ring shaped protrusion and/or the object, respectively.

For example, in the embodiment shown in FIG. 10 the first step 10 of detecting the object support can comprise the following steps. First in step 11 the object support is moved in a direction in the first plane. In step 12 a first location at the outer radius or inner radius is then determined by detecting a height difference. In step 13 the object support is further moved in the same direction, until in step 14 a second location at the outer radius or inner radius is determined by detecting height difference. In step 15 the distance between said first and second location is then determined, e.g. based on how much the object was moved in said direction. Based on said distance, and e.g. using the known inner and/or outer radius, the position of the ring shaped protrusion and/or the object support is determined in step 16. In an embodiment more locations, e.g. three or four, may be detected to improve the accuracy.

For example, in the embodiment shown in FIG. 10 the third step 30 of detecting the object can comprise the following steps. First in step 31 the object is moved in a direction in the first plane. In step 32 a first location at the radius is then determined by detecting height difference. In step 33 the object is further moved in the same direction, until in step 34 a second location at the radius is determined by detecting height difference. In step 35 the distance between said first and second location is then determined, e.g. based on how much the object was moved in said direction. Based on said distance, e.g. using the known radius, the position of the object is determined in step 36. In an embodiment more locations, e.g. three or four, may be detected to improve the accuracy.

In an embodiment the method comprises a step of determining a location of a marker on the object table or object support and/or a marker on the object, wherein the fourth step 40 of determining the position of the object relative to the ring shaped protrusion is done based on said location.

For example, in the embodiment shown in FIG. 10 the first step 10 of detecting the object support can comprise the following steps. First in step 11' the object support is moved in one or two directions in the first plane until in step 12' a marker is detected, e.g. based on a height profile. Based on a position of said marker, and e.g. taking into account that the object support is not rotated, the position of the ring shaped protrusion and/or the object support can be determined in step 13'. It is also possible to keep moving the object support until multiple markers are detected, and determine the position of the ring shaped protrusion and/or the object support based on the multiple markers.

For example, in the embodiment shown in FIG. 10 the third step 30 of detecting the object can comprise the following steps. First in step 31' the object is moved in one or two directions in the first plane until in step 32' a marker is detected, e.g. based on a height profile. Based on a position of said marker, and e.g. taking into account that the object is not rotated, the position of the object can be determined in step 33'. It is also possible to keep moving the object until multiple markers are detected, and determine the position of the object support based on the multiple markers.

It is noted that the markers can be used as an alternative for steps 11-16 or steps 31-36, or they can used in combination. For example, the object support or object may be moved in one direction. If a marker is detected the position of the object support or object can be determined based on that. If no marker is detected the object support or object can be moved further until the two locations are detected and the position of the object support or object can be determined based on that.

With reference to FIG. 8a a stage apparatus 101 according to a second aspect of the invention may also be explained. It is noted that the stage apparatus in FIG. 8 could thus be embodied in accordance with the first aspect, or in accordance with the second aspect. It is also possible to combine the first and second aspect in a single stage apparatus 101. The features of the stage apparatus according to the second aspect may be embodied and function in any of the ways similar to the ways described with respect to the first aspect. In addition any of the features mentioned with respect to the first aspect may also be comprised in an embodiment by the stage apparatus according to the second aspect.

According to the second aspect the stage apparatus 101 comprises an object support 102 comprising a plurality of burls 102.2 configured to support the object 105, and a sensor module comprising a level sensor 200 configured to detect at least one burl 102.2 of the plurality of burls 102.2, and the object 105 when it is arranged on the object support 102. The stage apparatus 101 further comprises a processing unit configured to receive one or more signals from the sensor module, and to determine, based on said one or more signals, a position of the object 105 relative to the object support 102 when the object 105 is arranged on the object support 102. The processing unit is further configured to determine, based on said position of the object, an offset value representing the position of the object 105 relative to the object support 102.

The level sensor may e.g. detect a burl 102.2 by detecting a height difference. In an embodiment the level sensor 200 may in particular be configured to detect the burls 102.2 that are most radially outward, e.g. arranged on in a circular row. Optionally the vertical object support positioner 112 is provided to arrange the object support 102 in the focus range of the level sensor 200, as is e.g. shown in FIG. 8*b*.

It is noted that although the object 105 shown in FIG. 8*a* has a radius in the first plane xy that is larger than object support 102, this is not required for the stage apparatus according to the second aspect. For example, the radius of the object 105 may be smaller than the outer radius and optionally the inner radius of the ring shaped protrusion.

It is noted that although the stage apparatus 101 shown in FIG. 8*a*-8*b* comprises the ring shaped protrusion 102.1, the second aspect of the invention may also be applied for a stage apparatus 101 which does not comprise such ring shaped protrusion 102.1.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Other aspects of the invention are set-out as in the following numbered clauses.

1. A stage apparatus, comprising:
   an object support,
      i. comprising a ring shaped protrusion having an outer radius in a first plane, and
      ii. configured to support an object with a radius in the first plane larger than the outer radius of the ring shaped protrusion,
   a sensor module configured to detect
      i. the object support, and
      ii. the object when it is arranged on the object support,
   a processing unit configured to
      i. receive one or more signals from the sensor module,
      ii. determine, based on said one or more signals, a position of the object relative to the ring shaped protrusion when the object is arranged on the object support, and
      iii. determine, based on said position of the object, an offset value representing the position of the object relative to the ring shaped protrusion.
2. The stage apparatus according to clause 1, wherein the sensor module is configured to detect the object support when no object is arranged on the object support.
3. The stage apparatus according to clause 1 or clause 2, wherein the sensor module is configured to detect the object support by detecting the ring shaped protrusion.
4. The stage apparatus according to one or more of the preceding clauses, the processing unit further comprising an output terminal configured to output the offset value to a control unit of an object handler and/or a control unit of an object support positioner.
5. The stage apparatus according to one or more of the preceding clauses, further comprising an object handler, which object handler comprises:
   a robot arm configured to provide a subsequent object to the object support,
   a control unit configured control, based on said offset value:
      i. a position of said subsequent object relative to the robot arm when the robot arm receives said subsequent object, and/or
      ii. a position of the robot arm relative to the object support when the robot arm arranges said subsequent object relative to the object support.
6. The stage apparatus according to clause 5, wherein the object handler further comprises a pre-aligner from which the robot arm receives the subsequent object, wherein the control unit is configured to control the position of said subsequent object relative to the robot arm when the robot arm receives said subsequent object, by controlling the position of the pre-aligner and/or the position of the object on the pre-aligner.
7. The stage apparatus according to one or more of the preceding clauses, wherein the processing unit is configured to determine the position of the object relative to the ring shaped protrusion by determining two locations of the ring shaped protrusion and/or two locations of the object.
8. The stage apparatus according to one or more of the preceding clauses, wherein the sensor module comprises a level sensor.
9. The stage apparatus according to one or more of the preceding clauses, wherein the sensor module comprises an optical sensor.
10. The stage apparatus according to one or more of the preceding clauses, further comprising a vertical object support positioner configured to
   position the object support in a direction perpendicular to the first plane, and
   to position the object support in a focus range of the sensor module in said direction for the sensor to detect the object support.
11. The stage apparatus according to one or more of the preceding clauses, further comprising a horizontal object support positioner configured to
   position the object support in a plane parallel to the first plane, and
   to position the object support in said plane before the object support is configured to receive a subsequent object, based on the offset value.
12. The stage apparatus according to clause 10 and clause 11, comprising an object support positioner which comprises the horizontal object support positioner and the vertical object support positioner.
13. The stage apparatus according to one or more of the preceding clauses, wherein the object support and/or an object table further comprises one or more markers configured to be detectable by the sensor module.
14. The stage apparatus according to clause 13, wherein the processing unit is configured to determine the position of the object support based on a single marker.
15. The stage apparatus according to one or more of the preceding clauses, wherein the ring shaped protrusion comprises an air seal.

16. The stage apparatus according to one or more of the preceding clauses, wherein the object is a test object and the stage apparatus comprises said test object, which test object:
   comprises substantially the same radius in the first plane as an object that is to be arranged on the object support, and
   is semi-transparent for the sensor module, thereby allowing the sensor module to simultaneously detect the object support and the test object, when the test object is arranged on the object support.

17. The stage apparatus according to one or more of the preceding clauses, wherein the object and/or the subsequent object is a substrate.

18. A lithographic apparatus comprising:
   a projection system for projecting the pattern onto a substrate,
   the stage apparatus according to one or more of the preceding clauses.

19. Method for calibrating an object loading process, comprising the steps of:
   detecting an object support comprising an ring shaped protrusion extending in a first plane between an inner radius and an outer radius,
   arranging an object on the object support, the object having a radius larger than the outer radius of the ring shaped protrusion, and detecting the object when it is arranged on the object support,
   determining a position of the object relative to the ring shaped protrusion when the object is arranged on the object support, and
   determining, based on said position of the object, an offset value representing the position of the object relative to the ring shaped protrusion.

20. Method according to clause 19, wherein the step of arranging the object on the object support is done with a robot arm, and the method further comprises the step of controlling, based on said offset value,
   i. a position of a subsequent object relative to the robot arm when the robot arm receives the subsequent object, and/or
   ii. a position of the robot arm relative to the object support when the robot arm arranges the subsequent object relative to the object support.

21. Method according to clause 19 or clause 20, further comprising a step of determining two locations of the ring shaped protrusion and/or two locations of the object, and wherein the step of determining the position of the object relative to the ring shaped protrusion is done based on said locations.

22. Method according to clause 21, wherein the locations of the ring shaped protrusion and/or the object are determined by detecting a height difference indicating a border of the ring shaped protrusion and/or the object, respectively.

23. Method according to one or more of the clauses 19-22, further comprising a step of determining a position of a marker on an object table or the object support, and/or a marker on the object, wherein the step of determining the position of the object relative to the ring shaped protrusion is done based on said marker.

24. A stage apparatus, comprising:
   an object support comprising a plurality of burls configured to support an object,
   a sensor module comprising a level sensor configured to detect
   i. at least one burl of the plurality of burls, and
   ii. the object when it is arranged on the object support,
   a processing unit configured to
   i. receive one or more signals from the sensor module,
   ii. determine, based on said one or more signals, a position of the object relative to the object support when the object is arranged on the object support, and
   iii. determine, based on said position of the object, an offset value representing the position of the object relative to the object support.

25. Method for calibrating an object loading process, comprising the steps of:
   detecting, with a level sensor, an object support comprising a plurality of burls configured to support an object,
   arranging an object on the burls of the object support, and detecting, with a level sensor, the object when it is arranged on the object support,
   determining a position of the object relative to the object support when the object is arranged on the object support, and
   determining, based on said position of the object, an offset value representing the position of the object relative to the object support.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A stage apparatus, comprising:
   an object support, comprising a ring shaped protrusion having an outer radius in a first plane and a plurality of burls disposed within an interior region of the object support defined by the ring shaped protrusion, and wherein the object support is configured to support an object with a radius in the first plane larger than the outer radius of the ring shaped protrusion;
   a sensor module configured to detect the object support by detecting the ring shaped protrusion, and one or more of:
      the object support when the object is arranged on the object support,
      the object when it is arranged on the object support, and
      the object support when no object is arranged on the object support, and
   a processing unit configured to:
      receive one or more signals from the sensor module,
      determine, based on the one or more signals, a position of the object relative to the ring shaped protrusion when the object is arranged on the object support, and
      determine, based on the position of the object, an offset value representing the position of the object relative to the ring shaped protrusion.

2. The stage apparatus of claim 1, further comprising an object handler, wherein the object handler comprises:
   a robot arm configured to provide a subsequent object to the object support; and
   a control unit configured to control, based on the offset value:
      a position of the subsequent object relative to the robot arm when the robot arm receives the subsequent object, and/or
      a position of the robot arm relative to the object support when the robot arm arranges the subsequent object relative to the object support.

3. The stage apparatus of claim 2, wherein:
   the object handler further comprises a pre-aligner from which the robot arm receives the subsequent object; and
   the control unit is configured to control the position of the subsequent object relative to the robot arm when the robot arm receives the subsequent object, by controlling the position of the pre-aligner and/or the position of the object on the pre-aligner.

4. The stage apparatus of claim 1, wherein the processing unit is configured to determine the position of the object relative to the ring shaped protrusion by determining two locations of the ring shaped protrusion and/or two locations of the object.

5. The stage apparatus of claim 1, wherein the sensor module comprises a level sensor.

6. The stage apparatus of claim 1, wherein the sensor module comprises an optical sensor.

7. The stage apparatus of claim 1, further comprising:
   a vertical object support positioner configured to:
      position the object support in a direction perpendicular to the first plane, and
      to position the object support in a focus range of the sensor module in the direction for the sensor to detect the object support.

8. The stage apparatus of claim 1, further comprising:
   a horizontal object support positioner configured to:
      position the object support in a plane parallel to the first plane, and
      to position the object support in the plane before the object support is configured to receive a subsequent object, based on the offset value.

9. The stage apparatus of claim 1, comprising an object support positioner that comprises a horizontal object support positioner and a vertical object support positioner.

10. The stage apparatus of claim 1, wherein the object support and/or an object table further comprises one or more markers configured to be detectable by the sensor module.

11. The stage apparatus of claim 1, wherein the ring shaped protrusion comprises an air seal.

12. The stage apparatus of claim 1, wherein:
    the object is a test object;
    the stage apparatus comprises the test object; and
    the test object:
       comprises substantially the same radius in the first plane as an object that is to be arranged on the object support, and
       is semi-transparent for the sensor module, thereby allowing the sensor module to simultaneously detect the object support and the test object, when the test object is arranged on the object support.

13. A lithographic apparatus comprising:
    a projection system for projecting a pattern onto a substrate; and
    a stage apparatus, comprising:
       an object support, comprising a ring shaped protrusion having an outer radius in a first plane and a plurality of burls disposed within an interior region of the object support defined by the ring shaped protrusion, and wherein the object support is configured to support an object with a radius in the first plane larger than the outer radius of the ring shaped protrusion;
       a sensor module configured to detect the object support by detecting the ring shaped protrusion, and one or more of:
          the object support when the object is arranged on the object support,
          the object when it is arranged on the object support, and
          the object support when no object is arranged on the object support, and
       a processing unit configured to:
          receive one or more signals from the sensor module,
          determine, based on the one or more signals, a position of the object relative to the ring shaped protrusion when the object is arranged on the object support, and
          determine, based on the position of the object, an offset value representing the position of the object relative to the ring shaped protrusion.

14. A method comprising:
    detecting an object support comprising a ring shaped protrusion extending in a first plane between an inner radius and an outer radius and a plurality of burls disposed within an interior region of the object support defined by the ring shaped protrusion;
    arranging an object on the object support, the object having a radius larger than the outer radius of the ring shaped protrusion, wherein the arranging the object on the object support is done with a robot arm;
    detecting the object support by detecting the ring shaped protrusion, and one or more of: the object support when the object is arranged on the object support, the object when it is arranged on the object support, and the object support when no object is arranged on the object support;

determining a position of the object relative to the ring shaped protrusion when the object is arranged on the object support;

determining, based on the position of the object, an offset value representing the position of the object relative to the ring shaped protrusion; and controlling, based on the offset value:
- a position of a subsequent object relative to the robot arm when the robot arm receives the subsequent object, and/or
- a position of the robot arm relative to the object support when the robot arm arranges the subsequent object relative to the object support.

15. The method of claim 14, further comprising:
determining two locations of the ring shaped protrusion and/or two locations of the object, and wherein the determining the position of the object relative to the ring shaped protrusion is done based on the locations.

16. The method of claim 14, further comprising:
determining a position of a marker on an object table or the object support, and/or a marker on the object, and wherein the determining the position of the object relative to the ring shaped protrusion is done based on the marker.

17. A stage apparatus, comprising:
an object support comprising a plurality of burls and a ring shaped protrusion extending in a first plane configured to support an object;

a sensor module comprising a level sensor configured to detect the object support by detecting the ring shaped protrusion, and one or more of:
- at least one burl of the plurality of burls,
- the object support when the object is arranged on the object support,
- the object when it is arranged on the object support, and
- the object support when no object is arranged on the object support, and a processing unit configured to:
- receive one or more signals from the sensor module,
- determine, based on the one or more signals, a position of the object relative to the object support when the object is arranged on the object support, and
- determine, based on the position of the object, an offset value representing the position of the object relative to the object support.

18. A method comprising:
detecting, with a level sensor, an object support comprising burls and a ring shaped protrusion extending in a first plane configured to support an object;

arranging an object on the burls of the object support;

detecting the object support by detecting the ring shaped protrusion, and one or more of: the object support when the object is arranged on the object support, the object when it is arranged on the object support, and the object support when no object is arranged on the object support;

determining a position of the object relative to the object support when the object is arranged on the object support; and determining, based on the position of the object, an offset value representing the position of the object relative to the object support.

* * * * *